United States Patent
Dai et al.

(10) Patent No.: US 7,131,102 B2
(45) Date of Patent: Oct. 31, 2006

(54) FULL SIZED SCATTERING BAR ALT-PSM TECHNIQUE FOR IC MANUFACTURING IN SUB-RESOLUTION ERA

(75) Inventors: Chang-Ming Dai, Hsinchu (TW); Chung-Hsing Chang, Hsin-Chu (TW); Jan-Wen You, Jungli (TW); Burn J. Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 335 days.

(21) Appl. No.: 10/782,670

(22) Filed: Feb. 19, 2004

(65) Prior Publication Data
US 2004/0161679 A1     Aug. 19, 2004

Related U.S. Application Data

(62) Division of application No. 10/205,790, filed on Jul. 26, 2002, now Pat. No. 6,711,732.

(51) Int. Cl.
G06F 17/50       (2006.01)

(52) U.S. Cl. .......................................... 716/19; 716/21

(58) Field of Classification Search ............ 716/19–21; 430/5
See application file for complete search history.

(56) References Cited

U.S. PATENT DOCUMENTS

| | | | |
|---|---|---|---|
| 5,573,890 A | 11/1996 | Spence | 430/311 |
| 5,858,580 A | 1/1999 | Wang et al. | 430/5 |
| 5,882,827 A | 3/1999 | Nakao | 430/5 |
| 5,994,002 A | 11/1999 | Matsuoka | 430/5 |
| 6,210,841 B1 | 4/2001 | Lin et al. | 430/5 |
| 6,228,539 B1 | 5/2001 | Wang et al. | 430/5 |
| 6,673,638 B1* | 1/2004 | Bendik et al. | 438/14 |
| 2002/0015900 A1* | 2/2002 | Petersen | 716/19 |
| 2002/0186356 A1* | 12/2002 | Smith | 355/53 |

* cited by examiner

*Primary Examiner*—Paul Dinh
(74) *Attorney, Agent, or Firm*—Thomas, Kayden, Horstemeyer & Risley

(57) ABSTRACT

A process is described for shrinking gate lengths and poly interconnects simultaneously during the fabrication of an integrated circuit. A positive tone photoresist is coated on a substrate and is first exposed with an alternating phase shift mask that has full size scattering bars which enable a gate dimension to be printed that is ¼ to ½ the size of the exposing wavelength. The substrate is then exposed using a tritone attenuated phase shift mask with a chrome blocking area to protect the shrunken gates and attenuated areas with scattering bars for shrinking the interconnect lines. Scattering bars are not printed in the photoresist pattern. The process affords higher DOF, lower OPE, and less sensitivity to lens aberrations than conventional lithography methods. A data processing flow is provided which leads to a modified GDS layout for each of the two masks. A system for producing phase shifting layout data is also included.

14 Claims, 7 Drawing Sheets

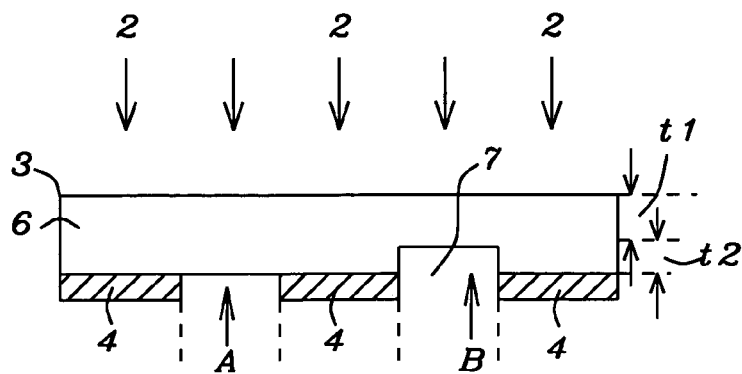
FIG. 1a – Prior Art
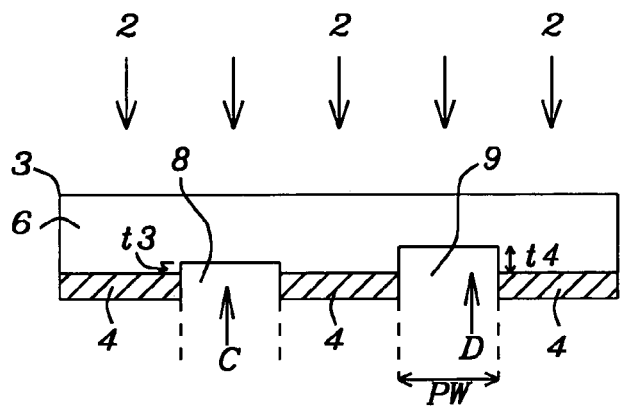
FIG. 1b – Prior Art
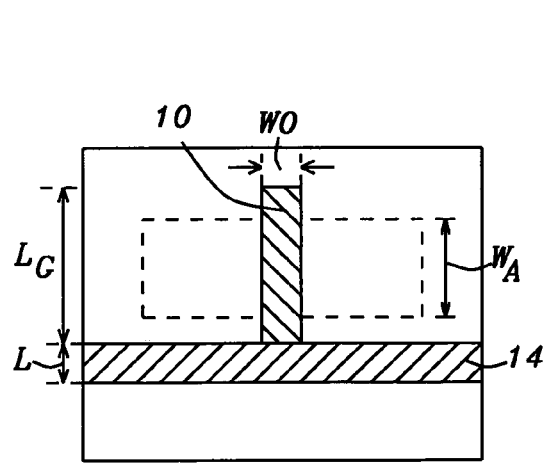
FIG. 2a
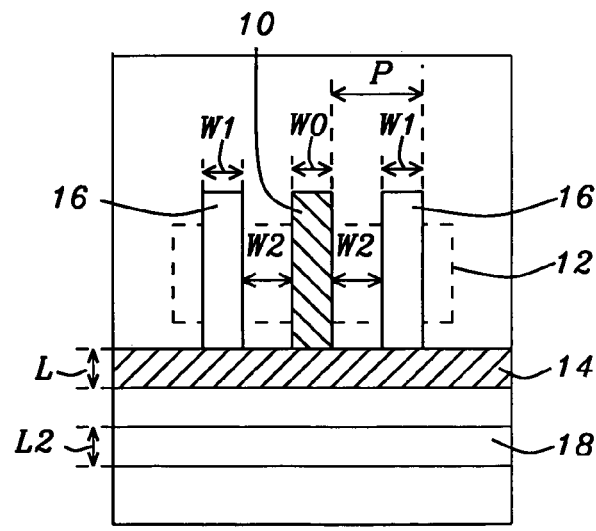
FIG. 2b

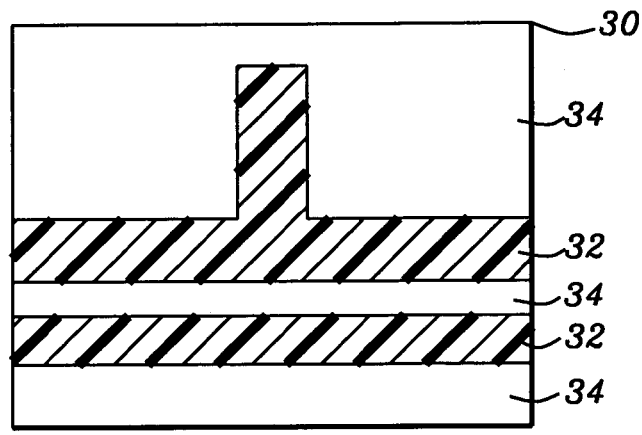
FIG. 4b
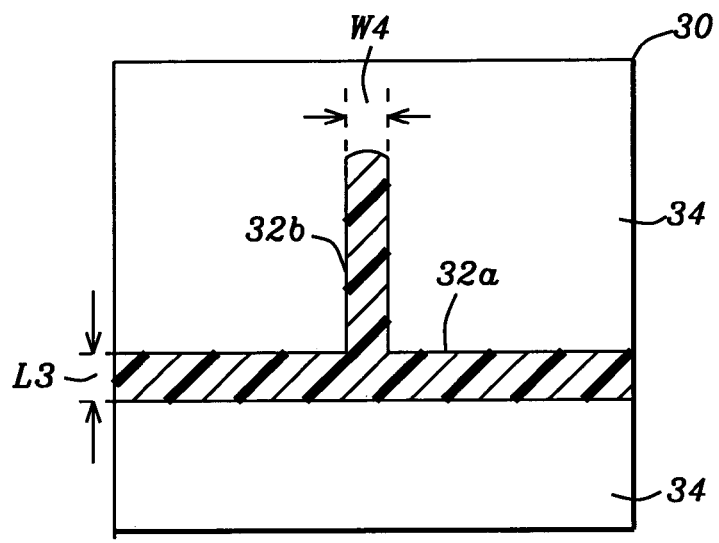
FIG. 5
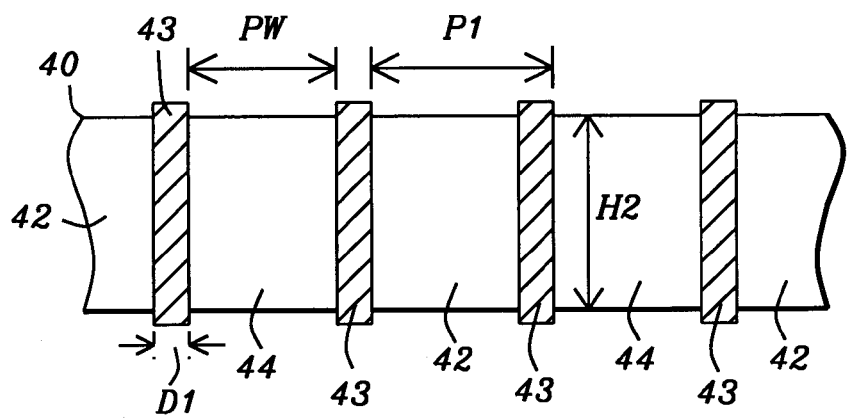
FIG. 6a – Prior Art

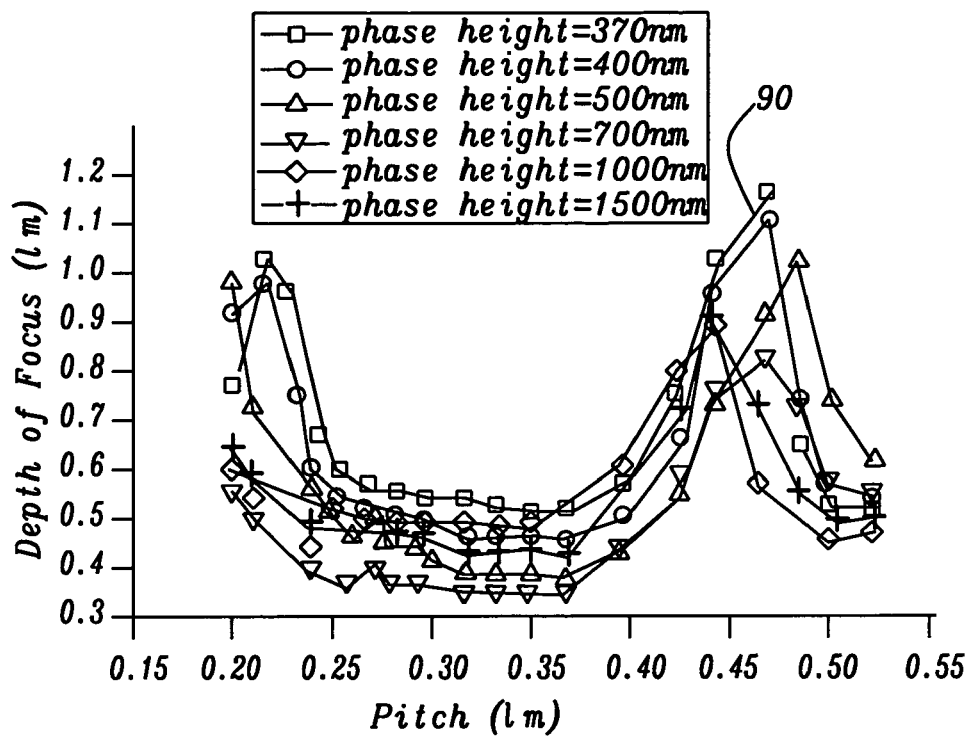
FIG. 9 – Prior Art
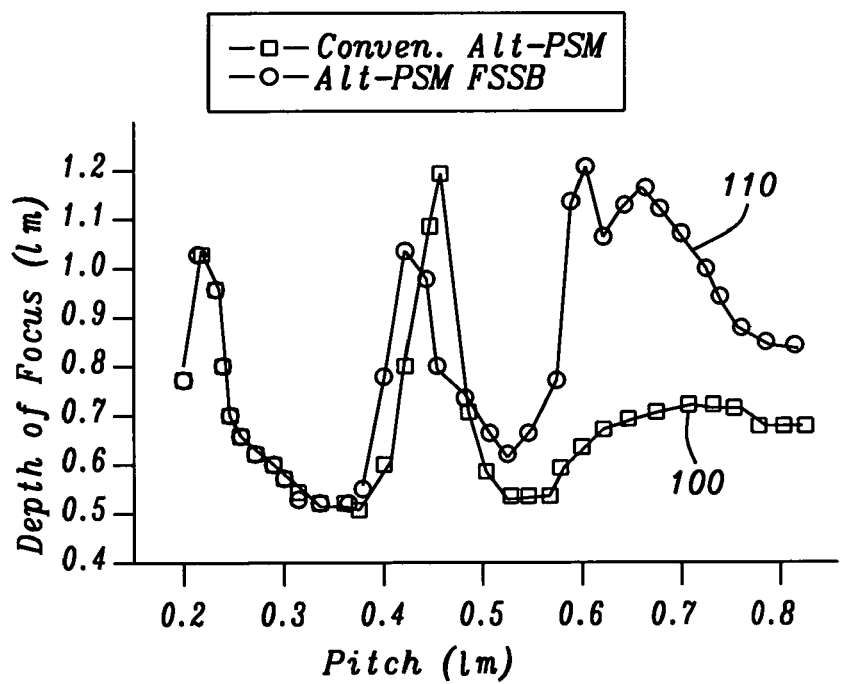
FIG. 10

FULL SIZED SCATTERING BAR ALT-PSM TECHNIQUE FOR IC MANUFACTURING IN SUB-RESOLUTION ERA

This is a division of patent application Ser. No. 10/205, 790, filing date Jul. 26, 2002 now U.S. Pat. No. 6,711,732, Full Sized Scattering Bar ALT-PSM Technique For IC Manufacturing In Sub-Resolution Era, assigned to the same assignee as the present invention.

FIELD OF THE INVENTION

The invention relates to a method of fabricating an integrated circuit in a microelectronic device. More particularly, the present invention relates to a method of forming smaller lithography patterns on substrates by using phase shifting masks.

BACKGROUND OF THE INVENTION

The fabrication of integrated circuits and semiconductor devices requires the application of a lithography process to define a pattern on a substrate. A photosensitive layer on a substrate is patternwise exposed with radiation that passes through a mask having opaque and transparent regions. A commonly used mask called a binary mask is comprised of an opaque material such as chrome or chromium on a transparent substrate which is typically quartz. The electric field or aerial image that exits from the mask during an exposure has a high intensity corresponding to light passing through transparent regions and a low intensity where light has been blocked by opaque regions. The aerial image is projected onto a photosensitive film called a photoresist to form exposed regions and unexposed regions. A small amount of radiation does reach "unexposed" regions, especially near borders with exposed regions because of diffracted light. This condition limits the minimum size of the features that can be formed or resolved in the photoresist pattern. Since there is a constant demand for decreasing feature size in order to build faster circuits or for a higher density of circuits per unit area, numerous resolution enhancement techniques have been developed during the past several years.

The minimum feature size that can be printed for a given process is defined as $R=k\lambda/NA$ where R is the minimum resolution, k is a constant for the process, $\lambda$ is the exposing wavelength, and NA is the numerical aperture of the projection optics in the exposure tool. A combination of lower k and lower $\lambda$ coupled with a higher NA has enabled a steady reduction in technology nodes in recent years from over 250 nm to 180 nm, 130 nm, and now to 100 nm. Traditionally, k is reduced by enhancements to the mask or lithographic process such as attenuated masks, off-axis illumination (OAI), optical proximity correction (OPC), scattering bars (SB) and high contrast photoresists.

The most popular exposure tools have been g-line (436 nm) and i-line (365 nm) steppers and scanners but Deep UV (248 nm) tools have been implemented to achieve resolution in the 130 nm to 250 nm range. Currently, 193 nm exposure tools are being accepted as the primary path to the 100 nm node. With each step in $\lambda$ reduction, the NA has been maximized to be in a range of about 0.7 to 0.85. If all the advances in k, $\lambda$, and NA are combined, the minimum feature size that can be achieved is about half wavelength. In other words, for the current technology based on 193 nm exposure tools, the smallest feature that can be reliably produced in manufacturing is about 90 to 100 nm. There is a need to push the imaging capability toward quarter wavelength with new optical enhancements since the time gap between each technology node is becoming shorter and exceeds the ability of tool manufacturers to match the pace with $\lambda$ and NA improvements. This is especially true for gate electrodes in transistors where the feature size is already sub-100 nm and is rapidly decreasing.

Attenuated phase shift masks have been widely introduced into manufacturing processes because they can enable a smaller resolution feature to be printed with a larger process window than with binary masks. One example is found in U.S. Pat. No. 6,210,841 in which an attenuated mask is formed by adding an attenuator material such as $MoSiO_xN_y$ to portions of the substrate. The thickness of the $MoSiO_xN_y$ is adjusted so that the phase of the light is shifted by 180° in regions where radiation passes through the attenuator. Scattering bars are also used to improve the resolution of the process to 130 nm.

A photoresist process is also characterized by its process latitude. That is the combination of focus and exposure dose settings that will generate a photoresist feature within a given linewidth or space width tolerance which is usually within ±10% of a targeted value. A focus latitude or depth of focus (DOF) of at least 0.4 microns and preferably near 1 micron or larger is desirable for an acceptable manufacturing process. At the same time, the dose latitude or acceptable range of exposure doses should be at least 10% (±5% about a target dose) and preferably 15% or greater. As an example, a gate feature size of 180 nm that is printed at a dose of 20 $mJ/cm^2$ and with a process having a DOF of 1 um and a dose latitude of 20% means that a feature sizes between 162 nm and 198 nm can be printed if the exposure dose stays within a range of 18 $mJ/cm^2$ to 22 $mJ/cm^2$ and the focal plane does not shift from best focus by more than 0.5 micron ($\mu m$) in either direction (toward plane of substrate or away from substrate). A phase shifted mask can help to increase process latitude besides improving resolution. This is valuable because expensive rework involving stripping the resist layer, recoating and re-exposing when linewidth is out of specification can be reduced which leads to a lower cost device.

An alternating phase shift (alt-PSM) approach first proposed by Levenson in 1988 appears to be the best method of achieving a quarter wavelength resolution. In the case of an alt-PSM with a single trench etched into the substrate as illustrated in FIG. 1a, exposing radiation 2 passes through two transparent regions with thicknesses $t_1$, and $t_1+t_2$ on opposite sides of an opaque region 4. The amount of quartz 6 that has been removed in the second transparent region to form trench 7 is thickness $t_2$ that has been determined according to an equation $(n-1)\times(t_2)=\frac{1}{2}\lambda$ where n is the refractive index of the quartz 6 and $\lambda$ is the exposing wavelength. The result is that the phase of light exiting region with thickness $t_1$ (through aperture B) is 180° out of phase with the light exiting the adjacent region with thickness $t_1+t_2$ (through aperture A). The phase width is shown as the distance PW. This relationship forms a higher contrast aerial image that exposes the photosensitive film on the substrate and allows smaller feature sizes to be printed with an alternating mask 3 than with a binary mask which has a uniform thickness of quartz and light of only one phase exiting apertures of the mask.

An alt-PSM 3 with a dual trench is shown in FIG. 1b. Trench 8 with a depth $t_3$ and trench 9 with a depth $t_4$ are etched into quartz 6. Distances $t_3$ and $t_4$ are adjusted so that radiation 2 that passes through alt-PSM 3 exits aperture C with a phase $\theta°$ and exits aperture D with a phase $(180+\theta)°$.

The distance ($t_2$, $t_3$, or $t_4$) that a trench is etched into a mask substrate will hereafter be referred to as a phase depth.

However, fabrication of alt-PSMs has been difficult in terms of automatic phase assignment, phase inspection and repair, and cycle time which increases cost beyond what many IC manufacturers can afford. Alt-PSM has a phase conflict problem because it creates dark resist (unexposed positive tone photoresist) at all areas corresponding to a 0° to 180° transition in the mask. Meanwhile, automatic phase assignment and alt-PSM design rule for an IC layout are very crucial for real applications. Spence (U.S. Pat. No. 5,573,890) and Wang (U.S. Pat. Nos. 5,858,580 and 6,228,539) reveal double exposure alt-PSM to overcome these concerns. Spence uses an alt-PSM and a structure mask in order to achieve a new gate length and remove unwanted dark lines formed by the phase shift method. However, this solution does not avoid the difficulty of making the mask. It also does not address polysilicon interconnect lines that must shrink in dimension simultaneously with a smaller gate size in order to realize the full benefit of smaller gates. Wang uses a dark field phase shifting mask for shrinking gate length and a structure mask to define polysilicon interconnects as well as protecting the shrunken gate. There is no alt-PSM rule checking to resolve phase conflicts and the structure mask is binary with a relaxed design rule that prohibits features near quarter wavelength from being printed.

Another alt-PSM technique is described in U.S. Pat. No. 5,994,002 and is primarily concerned with mask corrections to control an optical proximity effect where lines of equal size on the mask are separated by different space widths. Uncorrected masks tend to print isolated lines larger than dense lines in resist films. While the method deals with optical proximity effects, it does not mention correcting for lens aberrations or adjusting two different features on a mask which are printed simultaneously such as gate lines and polysilicon interconnects.

Still another alt-PSM method described in U.S. Pat. No. 5,882,827 combines alt-PSM and attenuated PSM features on the same mask to overcome alignment concerns. The mask appears difficult to produce because in some cases, the attenuated shifter material is overlaid on alt-PSM regions where the transparent quartz has been removed to adjust its thickness relative to the non-shifted transparent regions. This arrangement would be difficult to inspect and repair and therefore costly to make.

For the 100 nm technology node that is currently being implemented in manufacturing, gate lengths as small as 60 or 70 nm are being produced and there is no method with current lithography techniques to achieve this dimension. Typically, 100 nm gate features are printed in resist and then trimmed by a plasma etch to achieve a smaller size. This method requires an extra step of etching which can be costly and difficult to control if two or more feature sizes are trimmed at the same time. Therefore, it is desirable to have a lithography technique that is able to print features in photoresist that are about one quarter the size of the exposing wavelength. The method should provide an acceptable process window and be compatible with a manufacturing process flow. A logical layout management flow should be provided so that an appropriate mask or masks can be built.

SUMMARY OF INVENTION

One objective of the present invention is to provide a method for forming a feature in a photoresist layer that has a smaller dimension than can be produced by conventional resolution enhancement techniques. This is especially true for gate lengths.

A further objective of the present invention is to provide a method of shrinking two different features simultaneously such as a gate length and a polysilicon interconnect in an integrated circuit.

A still further objective of the present invention is to provide a data processing flow for defining a layer in an integrated circuit. The data enables an improved alt-PSM mask to be built in addition to a trim mask which together can be used to print shrunken gate and interconnect feature sizes.

A still further objective of the present invention is to provide a system for producing phase shifting layout data which can handle alt-PSM design rules, optical proximity corrections (OPC), scattering bar rules and gate blocking area generation for tritone attenuated PSM mask making.

These objectives are achieved through the design of an alt-PSM with full size scattering bars (FSSB) and an attenuated tritone mask hereafter referred to as att-PSM. The masks are employed in a double exposure method in which the alt-PSM with FSSB is used to primarily define a shrunken gate structure in a first exposure. The scattering bars enable a smaller phase width as illustrated in FIG. 6b that effectively permit a smaller gate size to be controllably manufactured. Phase height and phase width can be adjusted to improve depth of focus, especially for relaxed pitches and isolated lines. The optical proximity effect (OPE) is reduced by introducing the FSSB and this allows a higher flexibility in mask design. In addition, the effect of lens aberrations such as x-coma is minimized with the new alt-PSM which results in higher fidelity photoresist features, especially those with dimensions below the half wavelength size.

The chrome section of the tritone att-PSM protects the gate feature defined with the alt-PSM by preventing the erasure of phase shifting regions and preventing the creation of undesirable artifact regions that would otherwise be formed by the alt-PSM exposure. The scattering bar feature which is combined with the attenuated portion in the tritone att-PSM trims the polysilicon interconnect line to a smaller dimension than can be achieved with a binary mask. This enables the polysilicon interconnect to be shrunk at the same time as the gate feature. The blocking area (chrome region) of the att-PSM is based on the phase assignment of the alt-PSM. Examples of the alt-PSM with FSSB and the tritone att-PSM are found in FIGS. 3a and 3b, respectively.

A comprehensive data management flow is crucial to building quality masks for this double exposure approach. The system for producing phase shifting data is a command script comprised of alt-PSM design rules, OPC, scattering bar rules, and gate blocking area generation for the tritone att-PSM. The management flow involves first reading in the layout of diffusion (underlying active area) and poly layers. Next, design of the alt-PSM mask follows a sequence of alt-PSM rule check, assigning FSSB for small linewidths, assigning phases along gate area, and inputting OPC data. The next step is inputting the blocking area for shrunken gates including the assigned phase areas and polygate areas. Then the trim mask is designed by inserting data for polysilicon interconnects, the block area, and full size scattering bars that is generated through a set of parameters such as scattering bar size and separation between main pattern and scattering bar. After OPC data is determined and corrections are inputted, the final output is a modified GDS layout for the each mask. The GDS layout is subsequently used by the mask fabricators to produce the masks.

BRIEF DESCRIPTION OF THE DRAWINGS

FIGS. 1a and 1b are cross-sectional views of conventional alternating phase shift masks.

FIGS. 2a–2b show a layout extraction method for mask making according to an embodiment of the present invention.

FIGS. 4a–4b are top-down views of photoresist patterns on a substrate after the masks from FIGS. 3a–3b were used in a single exposure lithography process.

FIG. 5 is the resulting pattern in a photoresist layer after a double exposure method using the masks depicted in FIGS. 3a–3b.

FIG. 6a is a top-down view of a conventional alternating phase shift mask.

FIG. 9 is a graph that illustrates how phase height influences depth of focus at various pitch sizes in a conventional alt-PSM.

FIG. 10 is a graph that shows how an alt-PSM with FSSB can be optimized to improve depth of focus over a conventional mask for certain pitch sizes.

DETAILED DESCRIPTION OF THE INVENTION

The present invention is a method by which smaller feature sizes in photoresist layers on substrates can be printed than are currently available from other optical lithographic methods. An alternating PSM approach is modified and combined with an optimized attenuated PSM with capability for printing feature sizes at one quarter of the exposing wavelength. The invention is also a method by which the aforesaid masks are designed and a system for producing the phase shifting layout data.

Figure 8:
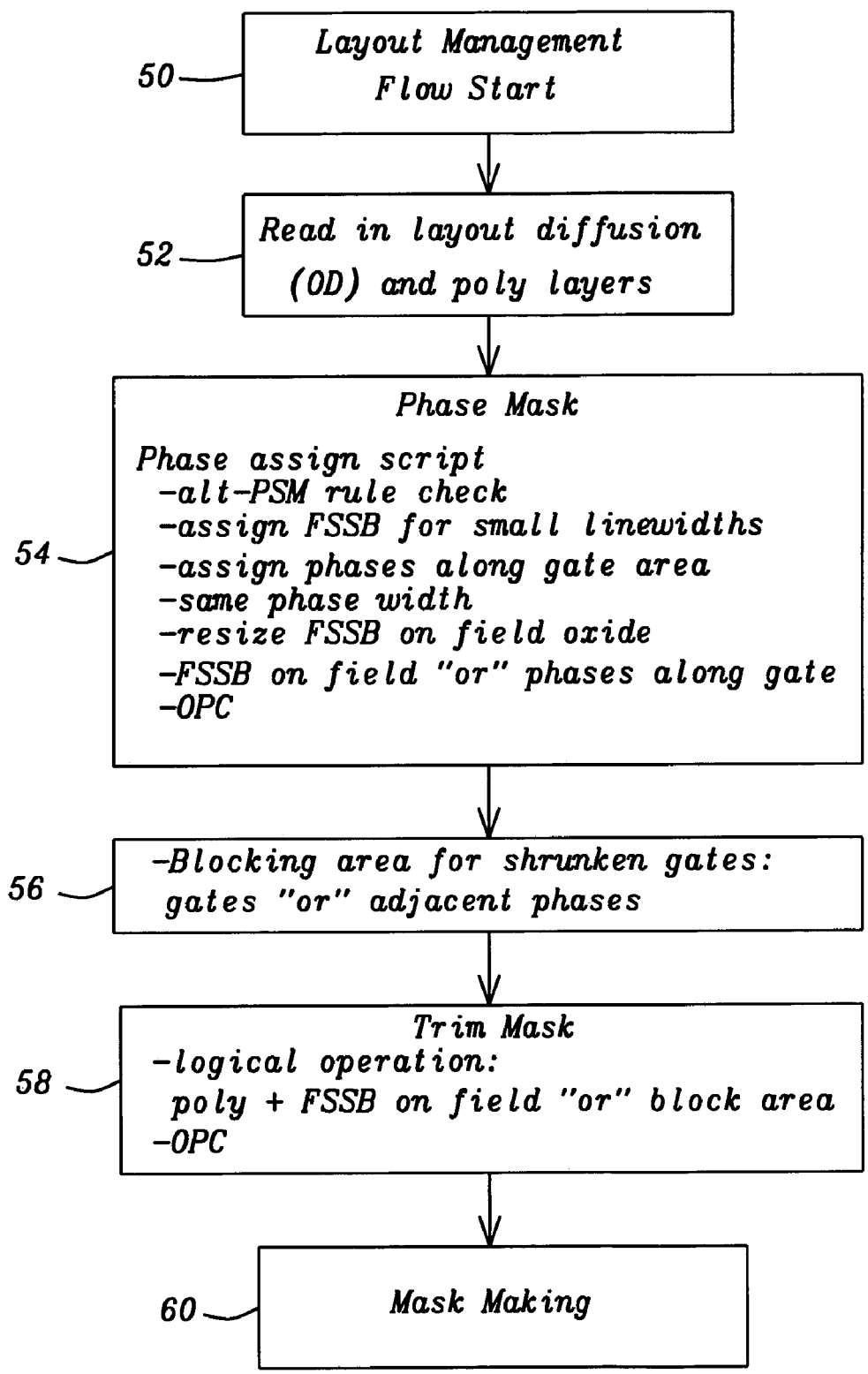
FIG. 8 is a flow diagram showing the data management sequence during a design of an alt-PSM with FSSB and a trim (tritone att-PSM) mask of the present invention.

In one embodiment, a method for layout management flow 50 is provided as illustrated in FIG. 8. Initially, data representing the location of the underlying diffusion (active area) which is indicated by the dashed line 12 in FIG. 2a is loaded into layout processing software. This software can be commercially available EDA IC design software or a set of script programs. The layout for polysilicon line 14 in FIG. 2a is also loaded into the software program according to step 52 in the flow sequence. The alt-PSM is then generated in step 54 by first checking the alt-PSM design rules for phase conflict between 0° and 180° phase regions or between $\theta°$ and $(180+\theta)°$ phase regions. These rules include a set of parameters for perpendicular gate, inter-digital gate, poly to poly pitch and line-end cap. Full size scattering bars (FSSB) shown as features 16 in FIG. 2b are assigned with linewidths $W_1$ that can be equal to or greater than the width $W_0$ of the gate feature 10. Then phases along the gate area are assigned with phase width $W_2$ and a phase that is either $\theta°$ or $(180+\theta)°$ where $\theta$ is from 0 to 180. All phase widths $W_2$ are equivalent. Other parameters such as phase extension, minimum phase width, phase spacing, and overlay offset are also included.

To enlarge the depth of focus (DOF) for printing a photoresist pattern with this alt-PSM, the linewidth $W_1$ of the FSSB 16 is resized by an amount that can vary in increments of about 10 nm according to pattern pitches. This adjustment may be a minor modification of FSSB size but is able to increase DOF by a significant amount.

Next optical proximity correction data is generated and inputted to modify the layout. OPC data can be rule-based or from an empirical resist model to assure that the fidelity of the feature printed in photoresist is close to the original IC layout.

Data for the gate block area is then processed in step 56. This block layer includes the assigned phase areas and polygate areas (true gate) to prevent erasing of the shrunken gate features. The gate block also applies to the att-PSM structure fabrication which maintains a chrome film on top of shrunken gate areas from the alt-PSM exposure to prevent light leakage from attacking these gates. The remainder of the trim (att-PSM) mask is designed in step 58. Features such as polysilicon interconnect lines 14, the block area (not shown), and full size scattering bars 18 in FIG. 2b are generated through a set of parameters such as scattering bar 18 size and separation between the main pattern 14 and the scattering bar 18. The attenuated part of the tritone mask such as scattering bar 18 is comprised of a semi-transparent half-tone film on a substrate. The half tone film can be formed from a material such as $MoSiO_xN_y$. The substrate is quartz when the exposing radiation is Deep UV (248 nm), i-line (365 nm) or g-line (436 nm) and is preferably $CaF_2$ when the radiation has 193 nm wavelength. The transparency of the attenuated stack is from about 1% to about 30% and the phase change is 180° compared to the phase exiting the substrate through regions with no attenuated layers.

The scattering bars 18 on the att-PSM can be either sub-resolution or full size scattering bars and have a width $L_2$ that is between 33% and 100% of the dimension L for line 14 (FIG. 2a). When scattering bar 18 is sub-resolution, it is not printed in the photoresist pattern. Full size scattering bars do print artifacts in a photoresist pattern. However, these artifacts are not printed in a double exposure method since the region containing the artifacts is exposed during the alt-PSM exposure. The scattering bar (SB) is used to improve depth of focus and resolution of the trim mask compared to one without SB. The SB is assigned according to a set of parameters that define its size, separation from the main feature, and how many scattering bars are along the main feature. The SB 18 is usually a distance of 1L to 2L away from interconnect 14 and can consist of one to three bars. The layout for the trim mask then goes through OPC generation and corrections are applied to form a modified GDS layout for the trim mask. Likewise, a modified GDS layout is done for the alt-PSM.

Figure 3A:
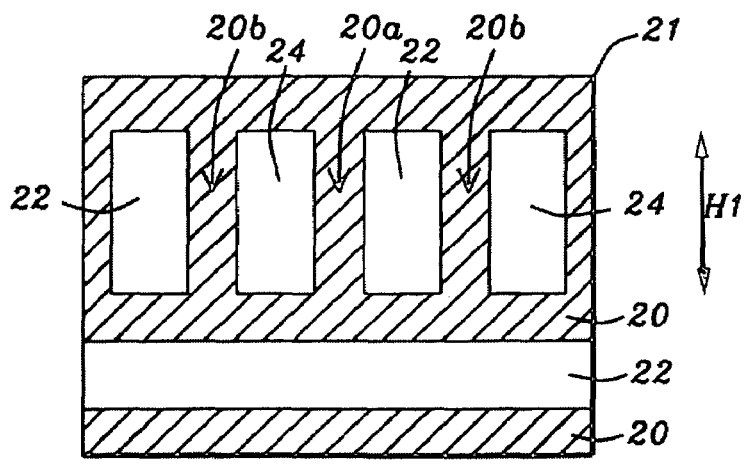
FIGS. 3a–3b are top-down views of phase and trim masks used in the double exposure method of the present invention.
Figure 3B:
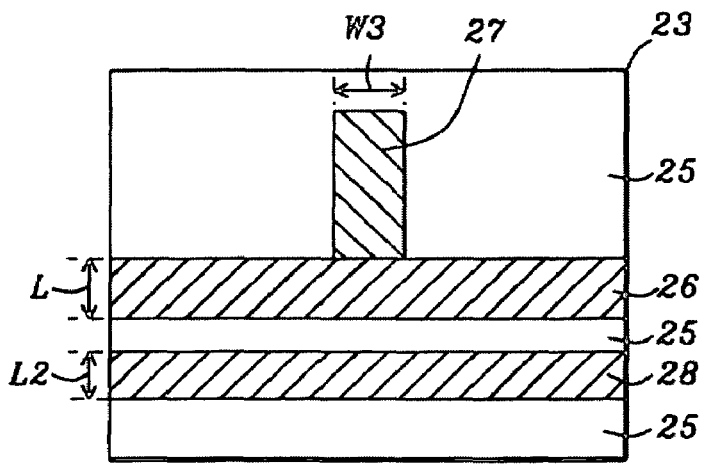

The final step 60 in the layout management flow is to send the GDS layouts to the mask fabricators. In this case, an alt-PSM 21 with FSSB is produced as shown in FIG. 3a and an att-PSM 23 with SB is produced as shown in FIG. 3b. Alt-PSM 21 may be a single trench or dual trench type as shown in FIGS. 1a and 1b, respectively. When alt-PSM 21 is a single trench type, the mask has opaque chrome regions 20, transparent substrate regions 22 that transmit light that exits the mask with 0° phase, and transparent substrate regions 24 having a thinner substrate thickness and transmitting light that exits the mask with 180° phase. It should be noted that phase shifted regions 24 are formed during the mask making process by a selective etch process and it is important that the phase depth $t_2$ as shown in FIG. 1a, is uniform over the entire mask. Otherwise, the phase of light exiting through aperture B will either be slightly larger (180°+θ) or slightly smaller (180°−θ) than the intended 180°. As a result of phase depth variations, the features printed in a photoresist are likely to be shifted in size and location from their intended placement.

When alt-PSM 21 is a dual trench type, shifts of θ° where θ is from 0 to 180 are designed into the layout and transparent regions 22 transmit light that exits the mask with a θ° phase while transparent regions 24 transmit light with a (180+θ)° phase. A high quality alt-PSM is one wherein the fabrication process allows the phase depths $t_2$, $t_3$, $t_4$ in FIGS. 1a and 1b to be controlled such that the phase shift is maintained within±3° of the intended shift in degrees across the entire mask. Phase height $H_1$ is defined as the height of the phase aperture or opening in regions 22 and 24 in FIG. 3a.

Att-PSM 23 in FIG. 3b is tritone because it consists of three distinct types of regions which are the chrome blocking area 27 having a width $W_3$ that is greater than $W_0$ in FIG. 2b, clear transparent regions 25, and attenuated regions 26 and 28 for the interconnect line and scattering bar, respectively. Interconnect 26 and scattering bar 28 are both comprised of an attenuator material such as $MoSiO_xN_y$ which has been deposited on the mask substrate. A less desirable option is to construct a binary mask where interconnect 26 and scattering bar 28 are chrome but a binary mask does not have the resolution or process window that is afforded by an att-PSM.

A second embodiment of the present invention is a system for producing phase shifting layout data and consists of a command script comprising alt-PSM design rules, OPC, SB rules, and gate blocking area generation for tritone att-PSM. Initially, a single line transistor gate in an integrated circuit is identified. As shown in FIG. 2a, the gate 10 is given a width $W_0$ and length $L_G$ wherein the length $L_G$ (longer side of the rectangular feature) is orthogonal to the two longer sides of an underlying rectangle 12 that represents the active area. The length $L_G$ of the gate 10 in the phase mask design is greater than the width $W_A$ of the active region 12 by an extension amount that is sufficient to compensate for possible misalignment between masks carrying the phase and trim layouts. Then phase shifting areas are assigned for defining a phase mask having a single line transistor gate and first opaque areas.

For alt-PSM, a layout including phase shifting areas in an opaque field and another layout of phase 0° and phase 180° or phase θ and phase (180+θ)° are provided. The adjacent phase shift region must always be adjusted so that adjacent phase shift regions are 180° out of phase with each other. Those skilled in the art will recognize how to adjust the mask making process to provide phase regions of θ° and (180+θ)° for a dual trench type alt-PSM.

Then a gate block layer is defined which involves assigning phase areas and polygate areas (true gate) to prevent erasure of shrunken gates. This gate block information is also useful data for att-PSM mask fabrication that maintains a chrome film on top of shrunken gates to prevent light leakage from attacking the gates. Next a trim mask like the one shown in FIG. 3b is defined that includes interconnect 26 (poly layer excluding gate areas), block area 27 (a slight demagnification of the phase area), and sub-resolution or full size scattering bar 28 that are generated through a set of parameters such as scattering bar size and separation between the main pattern and the scattering bar. The width L of interconnect 14 in the design stage is larger than width $L_2$ of the scattering bar and larger than $W_0$ of the gate.

When scattering bar 28 is sub-resolution on the mask, it is not printed in resist but improves the DOF and resolution of the lithography process. If a full size scattering bar 28 is incorporated on the mask, then DOF will be increased more than with a sub-resolution scattering bar 28 but artifacts will be printed on the substrate. However, the FSSB artifact location is exposed by the phase mask and therefore will not remain in the photoresist pattern in the case of a double exposure technique.

The opaque gate block area 27 includes phase shifted areas on the phase layout and polygate on active area. Its size is demagnified somewhat for phase layouts and true gates in order to compensate for possible misalignment between first and second masks. Finally, these layouts go through OPC generation and then a modified GDS layout is provided for mask fabrication.

In a third embodiment, the present invention is a method of forming shrunken gates simultaneously with shrunken polysilicon interconnects in an IC manufacturing process. The method involves producing an alt-PSM with FSSB and an att-PSM with SB using a data management flow and system for producing phase shifting layout data as described in the first two embodiments. An alt-PSM 21 that can be either a single or dual trench type is provided as shown in FIG. 3a with chrome regions 20, 20a, and 20b, transparent regions 22 that transmit light which exits the mask with phase θ°, and transparent regions 24 that transmit light which exits the mask with phase (180+θ)°. Phase shifted regions 24 alternate with regions 22 and are spaced apart by chrome regions 20a and 20b.

Chrome region 20a is a shape that will be used to form a gate structure on a substrate. Chrome regions 20b correspond to full size scattering bars that are not printed in a photoresist layer but help to shrink the gate size and improve its process latitude compared to a conventional alt-PSM. The pattern in FIG. 3a is from a small section of the mask 21 and is repeated across alt-PSM 21.

Figure 6B:
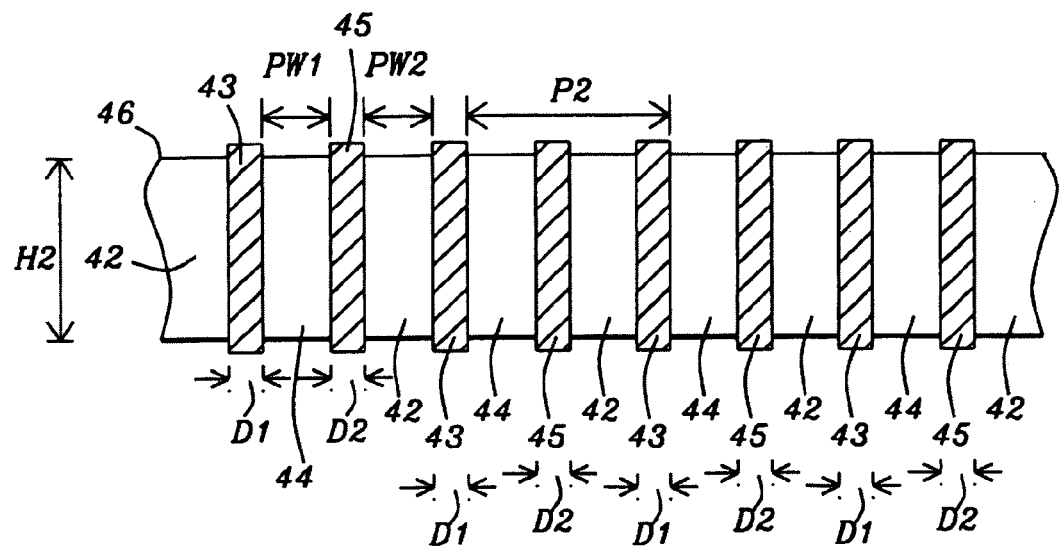
FIG. 6b is a top-down view of an alternating phase shift mask with full size scattering bars (FSSB) according to the present invention.

A further comparison of a conventional alt-PSM and an alt-PSM with FSSB is provided in FIG. 6a and FIG. 6b. Conventional alt-PSM 40 as shown in FIG. 6a has chrome lines of width $D_1$ corresponding to poly gates that separate alternating transparent regions 42 and 44 representing 0° and (180+θ)° phase areas, respectively, wherein θ is from 0 to 180. The phase width PW is the distance between adjacent chrome lines 43 and the pitch is the distance ($PW+D_1$) between one edge of one chrome line and the same edge of an adjacent chrome line 43. In an alt-PSM 46 with full size scattering bars 45 illustrated in FIG. 6b, the chrome line corresponding to the gate feature has width $D_1$ as before. However, full size scattering bars 45 having a width $D_2$ and comprised of chrome are positioned between each chrome line 43. $D_2$ is typically equal to or greater than $D_1$.

Between each pair of chrome lines 43, there is a θ° phase area 42 and a (180+θ)° phase area 44 that have equivalent phase widths $PW_2$ and $PW_1$, respectively. A finer resolution of the resulting gate in a patterned photoresist film can be achieved with mask 46 because the phase widths $PW_1$ and $PW_2$ can be made smaller than PW in mask 40.

A higher contrast aerial image is produced by mask 46 which enables a higher resolution and larger process window to be achieved in the lithographic patterning of substrates. An additional one or two full size scattering bars can be inserted between adjacent chrome lines 43 in phase mask 46 but the number is limited by the physical space. For instance, smaller pitches in the printed photoresist pattern in a range of about 250 nm to about 600 nm may only allow one FSSB 45 between adjacent chrome lines 43 in the alt-PSM. For larger pitches, a total ranging from one to three FSSB 45 may be placed between each chrome line 43. It should be noted that the size of the chrome lines 43 are larger on the mask than the resulting lines which are printed in the photoresist. Typically, the exposure system provides a 4× or 5× reduction in pattern size so a chrome feature on the mask will appear in the printed photoresist pattern as a feature ¼ or ⅕ of the original mask size.

A tritone att-PSM 23 (FIG. 3b) is also provided which has a chrome blocking area 27, highly transparent substrate regions 25, and attenuated regions 26 and 28 that allow a transmission between 1% and 30% of the exposing wavelength. Scattering bar 28 can be either sub-resolution or full size and has a width $L_2$ that is about 33% to 100% of the size of the width L of interconnect 26. When scattering bar 28 is sub-resolution in size, it is not printed in a photoresist layer but does help to print interconnect 26 at a smaller size and with a larger process window than is possible with a binary mask. In the case of a full size scattering bar 28, a larger process window is also realized and the artifacts that are printed by the trim mask in a single exposure mode are removed by the exposure with the phase mask in a double exposure method.

Figure 4A:
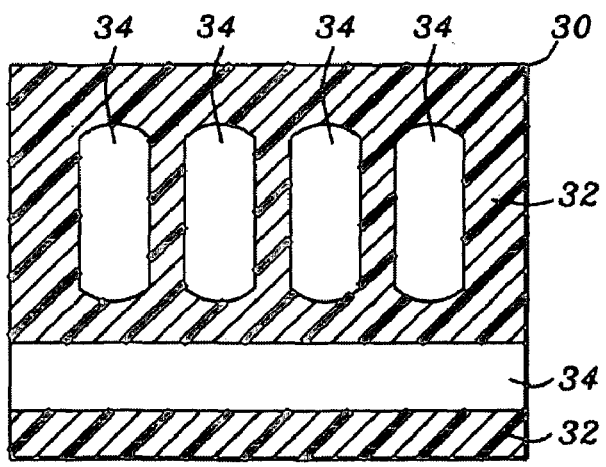

The alt-PSM 21 and the att-PSM 23 are used in a double exposure process of a substrate 30 coated with a positive tone photoresist film 32. In a positive tone photoresist, exposed regions become soluble in an aqueous base developer and are washed away while unexposed regions are insoluble in developer and remain on the substrate. Therefore, transparent regions on a mask become regions clear of photoresist on a developed substrate. FIG. 4a shows the resulting photoresist pattern on substrate 30 if only alt-PSM 21 is used during an exposure.

Alt-PSM 21 generally has transparent regions comprised of quartz and the exposing radiation consists of one or more wavelengths selected from a range of about 150 nm to 600 nm and is typically VUV (157 nm), 193 nm, Deep UV (248 nm), i-line (365 nm) or g-line (436 nm) radiation. Alt-PSM 21 typically has transparent regions comprised of $CaF_2$ when the exposing wavelength is 157 nm or 193 nm. As a result of the lithographic process involving patterning of photoresist 32 on substrate 30 with alt-PSM 21, clear substrate regions 34 are formed where exposed photoresist was washed away by developer. The four rectangular features 34 at the top of FIG. 4a are equivalent in size and shape even though they were formed by exposure with light of two different phases that are 0° and (180+θ)°. Regions 32 are unexposed photoresist.

FIG. 4b depicts a pattern in photoresist 32 on substrate 30 that would result from a single exposure with att-PSM 23. Clear regions 34 are formed corresponding to transparent regions in att-PSM 23 while photoresist 32 remains in areas corresponding to chrome or attenuated regions on att-PSM 23.

A key point in the present invention is that photoresist 32 on substrate 30 is not exposed with a single exposure but with two exposures followed by a single development step. First, photoresist 32 on substrate 30 is exposed with radiation through alt-PSM 21 using radiation selected from a wavelength or wavelengths in the range of about 150 nm to about 600 nm and then photoresist 32 is exposed with att-PSM 23 using a wavelength or wavelengths selected from a similar range. The wavelength used for the first exposure does not have to be the same wavelength used in the second exposure. However, throughput may be increased if the two exposures are performed in the same exposure tool at the same wavelengths. Substrate 30 is developed in aqueous base to give a pattern illustrated in FIG. 5. Because of the overlap of the two patterns from the two exposure steps, photoresist 32 only remains as a shrunken gate feature 32b and as a shrunken interconnect 32a. All other areas 34 on substrate 30 are clear of photoresist since they were exposed at least once.

Gate 32b has a width $W_4$ that is smaller than can be printed with binary or attenuated PSM masks in combination with resolution enhancement techniques. Moreover, interconnect 32a has a width L3 that has been shrunk by employing an att-PSM 23 with a scattering bar 28. Thus, both gate 32b and interconnect 32a have been shrunk simultaneously which has not been achieved in prior art. At this point, the photoresist pattern is typically plasma etch transferred through the underlying substrate which is normally polysilicon and then the photoresist is removed by a conventional stripping method.

Figure 7:
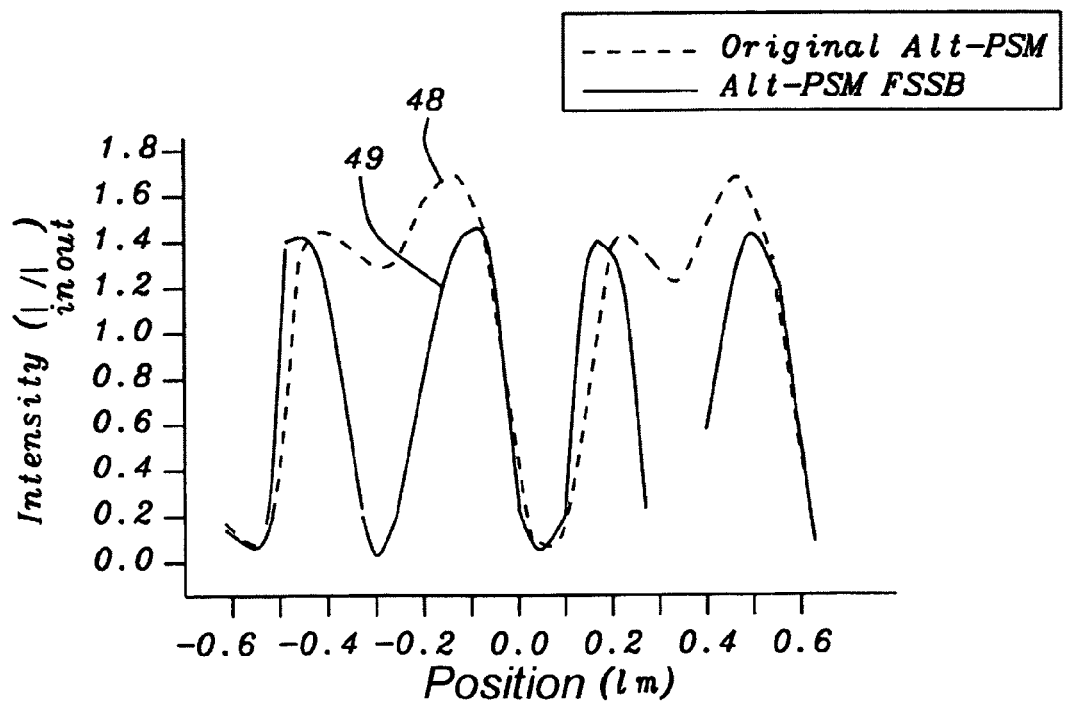
FIG. 7 shows an x-coma aberration in an aerial image from a conventional alt-PSM that is corrected by an alt-PSM with FSSB of the present invention.

Other benefits of an alt-PSM with full size scattering bars over a conventional alt-PSM are summarized in FIG. 7 and FIGS. 9–12. FIG. 7 shows that a conventional alt-PSM as represented by FIG. 6a is much more sensitive to lens aberrations than an alt-PSM with full size scattering bars as depicted in FIG. 6b. In both cases, the chrome lines 43 have a $D_1$, that will form 80 nm wide lines in a photoresist pattern with a pitch of 600 nm, the NA of the exposure tool is 0.60 and the 193 nm exposing wavelength has a coherence (σ) of 0.3. For the modified alt-PSM as shown in FIG. 6b, a scattering bar 45 has been inserted with a width $D_2$ that is 1.75 times larger than $D_1$.

In this example, the lens has an x-coma aberration and the response of a conventional alt-PSM is a merging of two adjacent phase regions in the aerial image exiting the mask as illustrated by curve 48 in FIG. 7 which will result in a degraded photoresist pattern. The contrast that was gained by having alternate phase shift regions has been lost because of the x-coma. On the other hand, the alt-PSM with FSSB of the present invention is not affected and the high contrast aerial image is retained as shown by the four distinct peaks in curve 49 corresponding to four adjacent phase regions 42, 44 in FIG. 6b, two with phase 0° and two with phase (180+θ)°. Since all exposure tools have some lens aberrations, an alt-PSM with full size scattering bars will be an advantage over conventional alt-PSM because it will be able to achieve a smaller resolution feature in exposed photoresist because of a lower sensitivity to aberrations like x-coma, y-coma and other higher order aberrations.

Referring to FIG. 9, the phase height $H_2$ in FIG. 6a in a conventional alt-PSM is adjusted and the resulting DOF is shown for phase heights $H_2$ between 370 nm and 1500 nm. Note that the resulting photoresist patterns have some "forbidden pitches" with sizes between about 250 nm and 380 nm (0.25–0.38 μm) where the DOF cannot be optimized much above 0.5 microns by this alt-PSM.

In FIG. 10, DOF can be increased relative to a conventional alt-PSM using an alt-PSM with FSSB especially for relaxed pitches where the space width between photoresist lines is at least 5 or 6 times larger than the linewidth. In this example, the targeted photoresist line size is 80 nm and for pitches of 500 nm size or greater, the alt-PSM with full size scattering bars provides a higher DOF (curve 110) than the conventional alt-PSM (curve 100).

Figure 11:
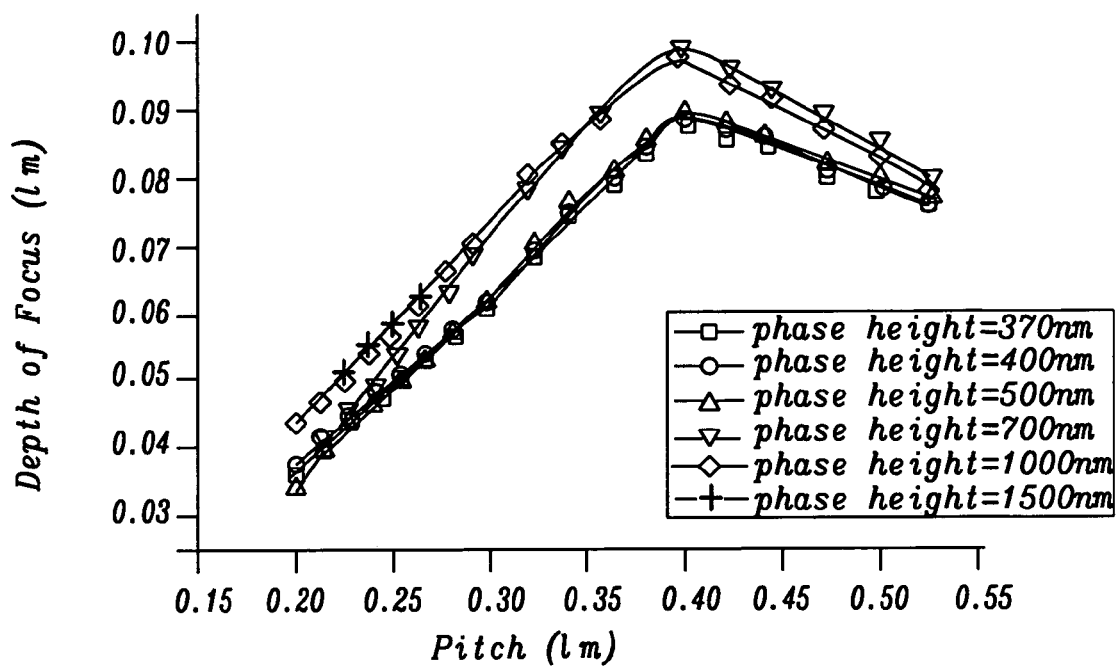
FIG. 11 is a graph showing the optical proximity effect (OPE) for a conventional alt-PSM at different phase heights.

Another benefit afforded by an alt-PSM with FSSB is a smaller optical proximity effect. As shown in FIG. 11, the linewidth or critical dimension (CD) of a line printed in photoresist is plotted on the y-axis and the pitch containing the line is plotted on the x-axis. The linewidths of the intended photoresist lines are 80 nm for all pitches. The exposing wavelength is 193 nm from a 0.6 NA tool with σ=0.3. The results are plotted for various phase heights ranging from 370 nm to 1500 nm. For all phase heights, the line is printed smaller than the targeted 80 nm (0.08 µm) at all pitches below 0.35 µm size and reaches a maximum width of about 100 nm at a pitch size of 0.40 µm. Ideally, the target CD should be printed as an 80 nm line at all pitches. To adjust for the actual results printed in photoresist, a separate correction is usually made for each pitch on the mask so that by exposing a corrected mask, the CD printed in photoresist will be about 80 nm for all pitches. The maximum optical proximity correction is expressed as the difference between the largest and smallest CDs printed from the uncorrected mask as illustrated in FIG. 11. Here the correction for all the curves corresponding to different phase heights ranges from about 55 to about 60 nm. A large correction is undesirable for mask designers since it requires more space on the layout that could otherwise be used to pack circuits more closely together.

Figure 12:
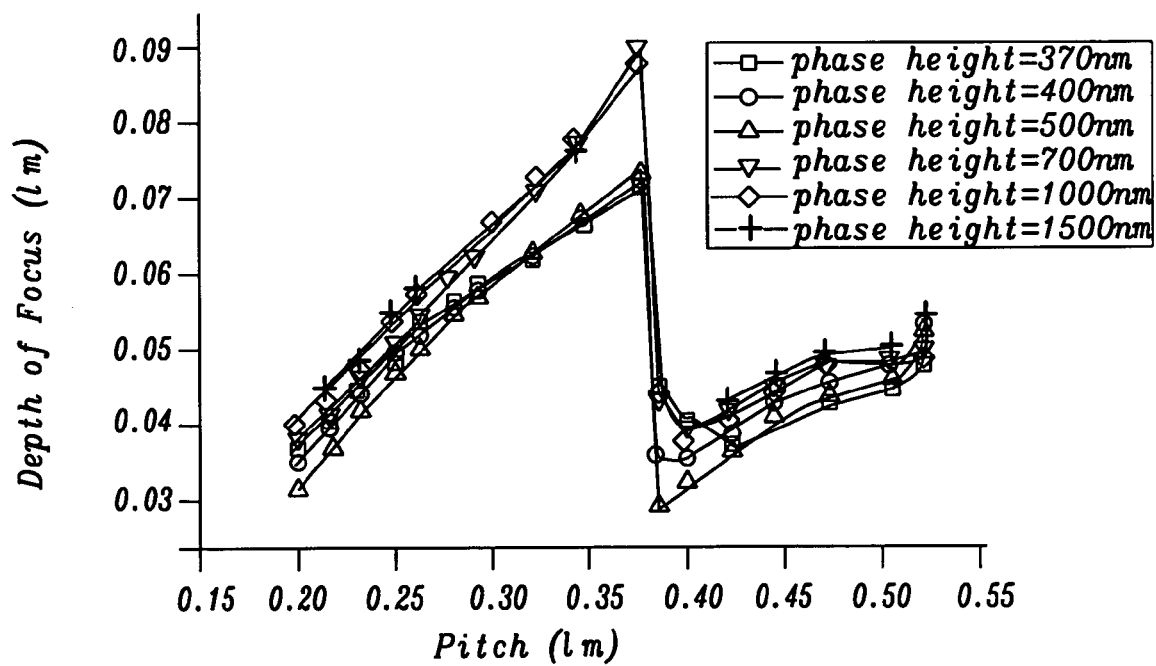
FIG. 12 is a graph showing how OPE is reduced by using an alt-PSM with FSSB.

In FIG. 12 the conventional alt-PSM is replaced by an alt-PSM with full size scattering bars and the optical proximity effect data is generated using the same exposure conditions as described for FIG. 11. As with the conventional alt-PSM, the printed linewidth is small for a 200 nm pitch and increases as pitch increases to 350 nm. However, in this example the maximum line size printed is about 90 nm at a 350 nm pitch. As the pitch changes from 350 nm to 375 nm, the printed line size decreases and then increases again as the pitch grows from 375 nm to 550 nm. The correction for all the curves with different phase heights ranges from about 45 to about 50 nm which is less than the values for a conventional alt-PSM. This improvement allows a greater flexibility in mask design which ultimately pays off in more circuits per substrate and a lower manufacturing cost.

Therefore, the third embodiment of the present invention enhances resolution and DOF for both gate and interconnect features which is an improvement over prior art that improves resolution only for gate features. In addition, the quality of the image that is printed in photoresist is improved over conventional alt-PSM because of a better image control that results from a lower sensitivity to lens aberrations. The incorporation of full size scattering bars leads to lower optical proximity corrections and a greater flexibility in mask design.

While this invention has been particularly shown and described with reference to, the preferred embodiments thereof, it will be understood by those skilled in the art that various changes in form and details may be made without departing from the spirit and scope of this invention.

We claim:

1. A method of forming a feature on a substrate comprising:
    performing a first exposure, with an alternating phase shift mask with full size scattering bars, on the substrate; and
    performing a second exposure, with a tritone attenuated mask having at least one wherein said full size scattering bars are not printed in the feature on the substrate from the second exposure.

2. The method of claim 1 wherein said first exposure is comprised of patternwise exposing a positive tone photoresist layer on said substrate through said alternating phase shift mask with scattering bars using radiation comprised of one or more wavelengths from about 150 nm to 600 nm.

3. The method of claim 1 further comprised of a single development step which follows the second exposure.

4. The method of claim 2 wherein the feature is comprised of line widths that are between ¼ and ½ of the exposing wavelength in size.

5. The method of claim 1 wherein said alternating phase shift mask is comprised of phase shift regions having a phase width that are separated by chrome regions.

6. The method of claim 5 wherein said chrome regions are comprised of chrome lines that are used to define shrunken gates in the feature and full size scattering bars wherein from one to three scattering bars are positioned between each chrome line.

7. The method of claim 6 wherein each chrome line and full size scattering bar separates a θ° phase shift region from a (180+θ)° phase shift region wherein θ is from 0 to 180.

8. The method of claim 6 wherein said full size scattering bars have a width that is equal to or greater than the width of said chrome lines that define the shrunken gates.

9. The method of claim 6 wherein said θ° phase shift region and said (180+θ)° phase shift region have phase widths that are equivalent.

10. The method of claim 1 wherein the tritone attenuated mask is comprised of a transparent region, an attenuated phase shift region, and a chrome block region that protects a shrunken gate formed by said first exposure.

11. The method of claim 10 wherein said attenuated phase shift region is comprised of an interconnect line feature having a width and a scattering bar which is a line parallel to said interconnect line feature and separated therefrom by a certain distance.

12. The method of claim 11 wherein said scattering bar has a width that is 33% to 100% of the width of said interconnect line feature.

13. The method of claim 11 wherein said certain distance between said scattering bar and said interconnect line feature is from about one to two times the width of said interconnect line feature.

14. The method of claim 11 wherein said scattering bar is sub-resolution in width.

* * * * *